United States Patent
Meng et al.

(10) Patent No.: US 11,937,438 B2
(45) Date of Patent: Mar. 19, 2024

(54) ORGANIC FIELD-EFFECT TRANSISTOR AND FABRICATION METHOD THEREFOR

(71) Applicant: PEKING UNIVERSITY SHENZHEN GRADUATE SCHOOL, Shenzhen (CN)

(72) Inventors: Hong Meng, Shenzhen (CN); Yuhao Shi, Shenzhen (CN); Xinwei Wang, Shenzhen (CN); Lin Ai, Shenzhen (CN)

(73) Assignee: PEKING UNIVERSITY SHENZHEN GRADUATE SCHOOL, Shenzhen (CN)

( * ) Notice: Subject to any disclaimer, the term of this patent is extended or adjusted under 35 U.S.C. 154(b) by 925 days.

(21) Appl. No.: 16/960,420

(22) PCT Filed: Apr. 17, 2020

(86) PCT No.: PCT/CN2020/085371
§ 371 (c)(1),
(2) Date: Jul. 7, 2020

(87) PCT Pub. No.: WO2021/208077
PCT Pub. Date: Oct. 21, 2021

(65) Prior Publication Data
US 2023/0093494 A1    Mar. 23, 2023

(30) Foreign Application Priority Data

Apr. 17, 2020 (CN) .......................... 202010307798.X

(51) Int. Cl.
*H01L 21/00* (2006.01)
*H10K 10/46* (2023.01)
*H10K 71/12* (2023.01)

(52) U.S. Cl.
CPC ........... *H10K 10/471* (2023.02); *H10K 71/12* (2023.02)

(58) Field of Classification Search
CPC ........................ H10K 10/471; H10K 71/12
See application file for complete search history.

(56) References Cited

U.S. PATENT DOCUMENTS

| | | | |
|---|---|---|---|
| 4,935,580 A | 6/1990 | Chao et al. | |
| 9,352,450 B1 | 5/2016 | Vail et al. | |
| 2004/0099952 A1* | 5/2004 | Goodner | H01L 21/02362 257/E21.255 |
| 2016/0148804 A1* | 5/2016 | Chang | H01L 21/465 438/158 |
| 2016/0293342 A1* | 10/2016 | Yumoto | H01G 9/2031 |
| 2016/0339561 A1 | 11/2016 | Vail | |

FOREIGN PATENT DOCUMENTS

| | | |
|---|---|---|
| CN | 1226286 A | 8/1999 |
| CN | 102110776 A | 6/2011 |
| CN | 103000809 A | 3/2013 |
| CN | 105336860 A | 2/2016 |
| CN | 106058047 A | 10/2016 |
| CN | 106328811 A | 1/2017 |
| CN | 110518119 A | 11/2019 |
| EP | 3597673 A1 | 1/2020 |
| JP | 2004063977 A | 2/2004 |
| KR | 10-2019-0118923 A | 10/2019 |

OTHER PUBLICATIONS

Examination Report dated May 17, 2022 of corresponding Chinese application No. 202010307798.X; 7 pages.
Translation of International Search Report dated Jan. 15, 2021 in corresponding International Application No. PCT/CN2020/085371; 2 pages.
Fei Huang et al., "Research progress of optoelectronic polymer materials", Acta Polymerica Sinica, vol. 50, No. 10, Oct. 2019, p. 988-1046 (including English-language Abstract).

* cited by examiner

*Primary Examiner* — Victor A Mandala
*Assistant Examiner* — Colleen E Snow
(74) *Attorney, Agent, or Firm* — Maier & Maier, PLLC

(57) ABSTRACT

An organic field-effect transistor and a fabrication method therefor, including: providing a gate; depositing polymer material onto the gate to form a dielectric layer; performing supercritical fluids treatment on the gate having the dielectric layer deposited; depositing organic semiconductor layer material on the dielectric layer having been processed, to form an organic semiconductor layer; depositing electrode layer material on the organic semiconductor layer and forming an electrode layer. The dielectric properties of the dielectric layer after adopting the supercritical fluids treatment have been significantly improved. While the hysteresis effect of the dielectric layers in the OFET devices has been basically eliminated, the sub-threshold slope of the OFET is also significantly reduced, the carrier mobility is effectively improved. Additionally, an OFET switching rate after being processed is improved, and, by connecting the LEDs in series, the switching rate of the LED is increased.

9 Claims, 6 Drawing Sheets

ORGANIC FIELD-EFFECT TRANSISTOR AND FABRICATION METHOD THEREFOR

CROSS-REFERENCE TO RELATED APPLICATIONS

This application is a national stage application of PCT Patent Application No. PCT/CN2020/085371, filed on Apr. 17, 2020, which claims priority to Chinese Patent Application No. 202010307798X, filed on Apr. 17, 2020, the content of all of which is incorporated herein by reference.

FIELD

The present disclosure relates to the technical field of organic electronic devices, and, more particularly, to an organic field-effect transistor and a fabrication method therefor.

BACKGROUND

In recent years, organic electronic devices have attracted much attention due to owning a high mechanical flexibility and a low manufacturing cost. Among the organic electronic devices, an organic field-effect transistor has been widely used as a core unit. A performance of the organic field-effect transistor is greatly affected by a dielectric layer, a plurality of factors including polarization, purity, and charge defect of the dielectric layer may seriously affect a plurality of properties of the device including a hysteresis effect, a large sub-threshold slope, a high leakage current, a low charge mobility and more, which will further affect a switching rate, a power consumption and a stability of a whole circuit. In addition, a mechanical property of the dielectric layer is also critical, especially for flexible and rollable display devices; a bending performance of the dielectric layer may determine a service performance and a service life of the whole display device. A material of the dielectric layer may conventionally be an inorganic oxide, an organic polymer and a mixture or a multilayer material. Among the materials, an organic polymer dielectric layer material has a particularly outstanding mechanical flexibility, which also has a better compatibility with a plurality of other organic materials in a device. These characteristics are very important for an application of a flexible device, including a rollable display, which needs a high requirement on a bending radius of the device, while most inorganic dielectric materials are hard to meet such a requirement.

However, a polymer dielectric layer material often contains a plurality of metal ions, the metal ion impurities come from a production process of raw materials of the polymer, thus it is hard to avoid and difficult to remove. The mobile metal ions may induce a serious effect on a threshold voltage drift of OFET (Organic Field-Effect Transistor) devices. In the prior work, polymer dielectric layers were improved by adding cross-linking agent, UV treatment, and air-annealing. However, these post-treatment methods cannot effectively remove water-absorbing functional groups and mobile ions in the polymer. A plurality of electrical properties of the OFET based on a polymer dielectric layer, including hysteresis effect, large sub-threshold slope, and low carrier mobility, are still not satisfactory, while these issues will severely limit an application of the OFET based on a polymer dielectric layer in a high-speed switching and a low-power consumption in organic circuit.

Therefore, the current technology needs to be improved and developed.

SUMMARY

According to the above described defects, the purpose of the present disclosure is providing an organic field-effect transistor and a fabrication method therefor, in order to solve a defect in the prior art that, the metal ionic impurities in a polymer dielectric layer are hard to remove.

The inventor has found that, the supercritical fluids combine both characteristics of gas and liquid, having a density and a viscosity less than that of the liquid, but a diffusion coefficient close to that of the gas. Therefore, the supercritical fluids have a very fast material transport capability. By adding a dehumidifying agent, including anhydrous calcium chloride, the supercritical fluid can quickly and efficiently remove a plurality of water molecules and impurities in a substance.

A technical solution of the present disclosure to solve the technical problems is as follows:

A fabrication method for an organic field-effect transistor, wherein comprising a plurality of steps:

providing a gate;

depositing a polymer material onto the gate, and forming a dielectric layer;

performing supercritical fluids treatment on the gate having the dielectric layer deposited;

depositing an organic semiconductor layer material on the dielectric layer having been processed, and forming an organic semiconductor layer;

depositing an electrode layer material on the organic semiconductor layer, and forming an electrode layer.

Further, the polymer material comprises at least one of polyvinyl alcohol, polyvinyl phenol, polymethyl methacrylate, and polyvinylidene fluoride.

Further, the gate comprises one of heavily doped single crystal silicon, an indium tin oxide-deposited polymer film, and a metal-deposited polymer film.

Further, a deposition method of the polymer material is a spin-coating method.

Further, the step of performing the supercritical fluid treatment on the gate having the dielectric layer deposited, comprising specifically: adopting carbon dioxide as a fluid, placing the gate having the dielectric layer deposited into a reaction kettle, adding a water-removing-agent, pressurizing the carbon dioxide to 1500-3000 psi before passing into the reaction kettle, raising a temperature of the reaction kettle to 60-120° C., and keeping for a process period of 30 minutes to 1 hour.

Further, the organic semiconductor layer material is at least one of pentacene, 2,7-dioctyl[1]benzothieno[3,2-B][1]benzothiophene.

Further, the method of depositing the organic semiconductor layer material is a vacuum thermal evaporation method, wherein a vacuum degree is $2\times10^{-6}$ Torr and an evaporation rate is 0.5 Angstroms per second.

Further, the method of depositing the electrode layer material is a vacuum thermal evaporation method, wherein a vacuum degree is $2\times10^{-6}$ Torr and an evaporation rate is 0.5 Angstroms per second.

Further, the electrode layer material comprises one of gold, copper, and aluminum.

An organic field-effect transistor, wherein prepared by adopting the fabrication method described in the present disclosure.

Benefits: the present disclosure adopts the supercritical fluid to process the dielectric layer, which can effectively reduce a content of the mobile ions in an entire dielectric layer, thus an OFET device adopting the dielectric layer can make a faster respond under a condition of a gate voltage changing, accelerate a switching rate of the transistor device, and reduce an effect of the mobile ions on the hysteresis effect. The polymer treated by the supercritical fluids treatment will have fewer defects, and an OFET adopting the dielectric layer may inject more carriers into a channel at a low voltage, which significantly reduces the sub-threshold slope of the device and effectively improves the carriers mobility. In addition, adopting the dielectric layer after being processed for a control transistor of display panel, benefit from the dielectric layer having an improved performance, a control switch responds faster, thus a display refresh rate can be improved significantly.

DETAILED DESCRIPTION OF EMBODIMENTS

The present disclosure provides an organic field-effect transistor and a fabrication method therefor, in order to make the purpose, technical solution and the advantages of the present disclosure clearer and more explicit, further detailed descriptions of the present disclosure are stated hereafter. It should be understood that the detailed embodiments of the disclosure described here are used to explain the present disclosure only, instead of limiting the present disclosure.

Figure 1:
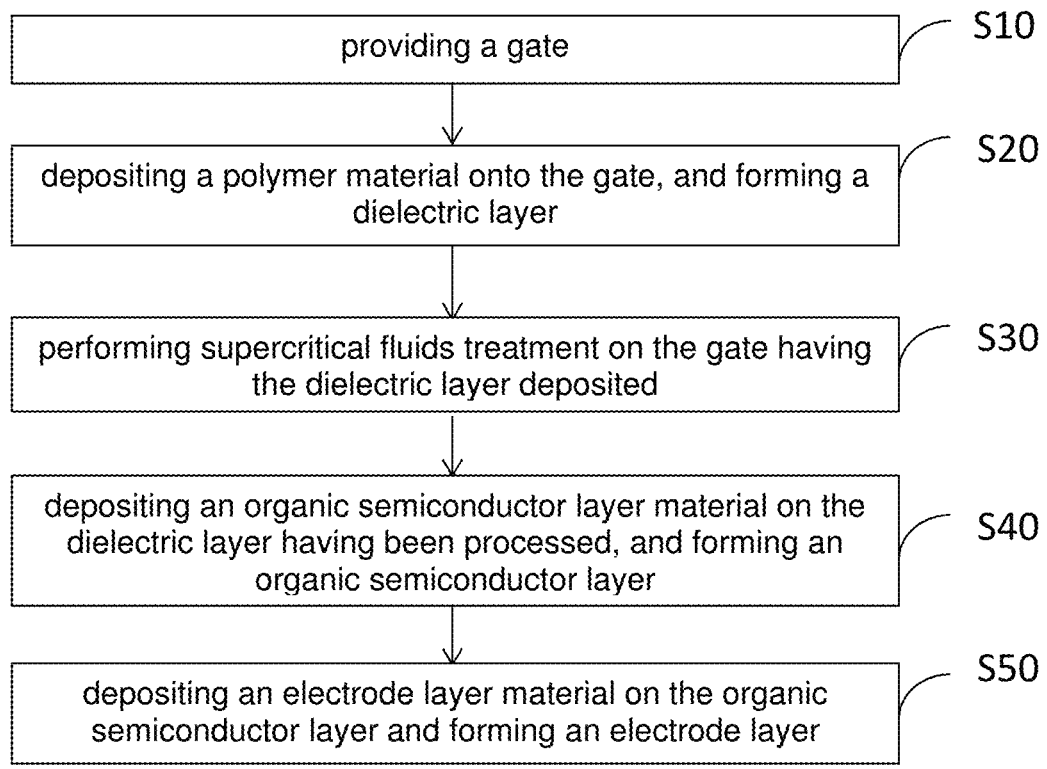
FIG. 1 illustrates a flow chart on a fabrication method of an organic field-effect transistor provided by an embodiment in the present disclosure.

An embodiment of the present disclosure provides a fabrication method for an organic field-effect transistor, shown as FIG. 1, comprising a plurality of steps:

S10, providing a gate;

S20, depositing a polymer material onto the gate, and forming a dielectric layer;

S30, performing supercritical fluids treatment on the gate having the dielectric layer deposited;

S40, depositing an organic semiconductor layer material on the dielectric layer processed, and forming an organic semiconductor layer;

S50, depositing an electrode layer material on the organic semiconductor layer, and forming an electrode layer.

In the embodiment of the present disclosure, adopting the supercritical fluid to process the dielectric layer, may effectively reduce a content of a plurality of mobile metal ions in an entire dielectric layer, thus an OFET device adopting the dielectric layer may respond faster under a condition of gate voltage changing, speeding up a switching rate of the transistor device, reducing an impact of a plurality of mobile ions on hysteresis. A plurality of defects in the polymer after the supercritical fluid treatment is reduced, and an OFET adopting the dielectric layer may inject more carriers into a channel at a low voltage, significantly reducing a sub-threshold slope of the device and effectively improving a carriers-mobility-rate. In addition, adopting the dielectric layer after being processed for a control transistor of a display panel, benefit from the dielectric layer having an improved performance, a control switch responds is faster, thus a display refresh rate can be improved significantly.

The step S10, wherein in an embodiment, the gate comprises any one of heavily doped single crystal silicon, an indium tin oxide (ITO)-deposited polymer film, a metal-deposited polymer film, and more. Wherein the heavily doped single crystal silicon refers to a semiconductor single crystal silicon having a relatively large impurity content doped, and a concentration of the impurity is generally greater than $10^{18}$ atoms per cubic centimeter.

The step S20, wherein in an embodiment, before depositing the polymer material onto the gate, further comprising a step: placing the gate in acetone, isopropanol, or deionized water and ultrasonic cleaning for 20 minutes, and after the cleaning, a treatment in an ultraviolet or ozone atmosphere for 15 minutes is needed.

In an embodiment, the polymer material comprises at least one of polyvinyl alcohol (PVA), polyvinyl phenol (PVP), polymethyl methacrylate (PMMA), polyvinylidene fluoride (PVDF), and more.

In an embodiment, the deposition method of the polymer material is a spin-coating method.

The step S30, wherein in an embodiment, the step of performing the supercritical fluid treatment on the gate having the dielectric layer deposited, comprising specifically: adopting carbon dioxide as a fluid, placing the gate having the dielectric layer deposited into a reaction kettle, adding a water-removing-agent (such as anhydrous calcium chloride), pressurizing the carbon dioxide to 1500-3000 psi before passing into a reaction kettle, raising a temperature of the reaction kettle to 60-120° C., and keeping for a process period of 30 minutes to 1 hour.

The step S40, wherein in an embodiment, the organic semiconductor layer material is one two of pentacene, 2,7-dioctyl[1]benzothieno[3,2-B][1]benzothiophene (C8-BTBT), and more.

In an embodiment, the method of depositing the organic semiconductor layer material may be a vacuum thermal evaporation method, wherein a vacuum degree is $2 \times 10^{-6}$ Torr and an evaporation rate is 0.5 Angstroms per second.

The step S50, wherein in an embodiment, the method of depositing the electrode layer material is a vacuum thermal evaporation method, wherein a vacuum degree is $2\times10^{-6}$ Torr and an evaporation rate is 0.5 Angstroms per second.

In an embodiment, the electrode layer material comprises one of gold, copper, aluminum, and more.

In the embodiments of the present disclosure, in a plurality of intervals between the step S30, the step S40, the step S50, the material should be avoided from contacting with high humidity air or should be performed under a nitrogen atmosphere, while an air humidity in a process environment should be less than 30%.

An embodiment of the present disclosure further provides an organic field-effect transistor, wherein prepared by adopting the fabrication method described in the embodiments of the present disclosure.

Further detailed descriptions of the present disclosure are stated below, referencing to some embodiments of the present disclosure.

Embodiment 1

Figure 2:
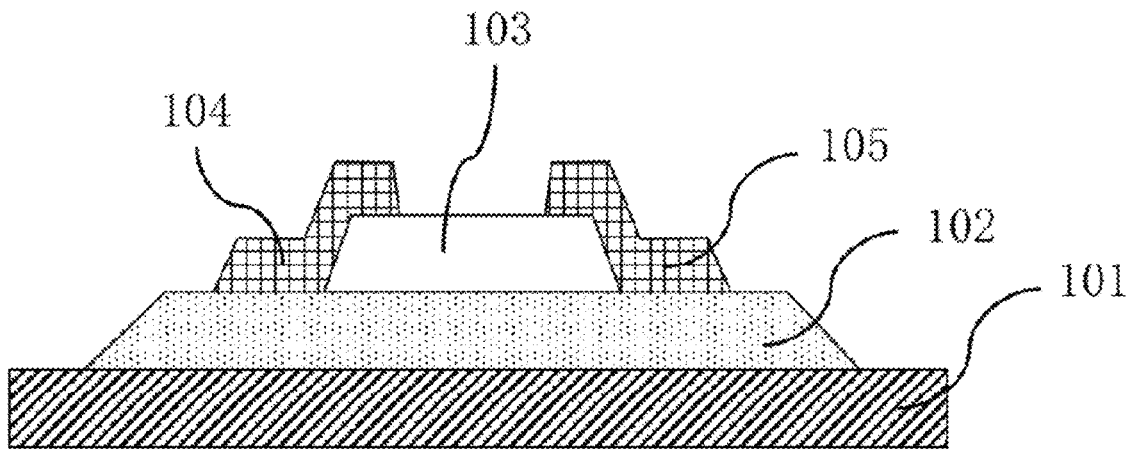
FIG. 2 illustrates a schematic diagram on a structure of the organic field-effect transistor adopting a dielectric layer treated by supercritical fluids provided by an embodiment 1 in the present disclosure.
Figure 3:
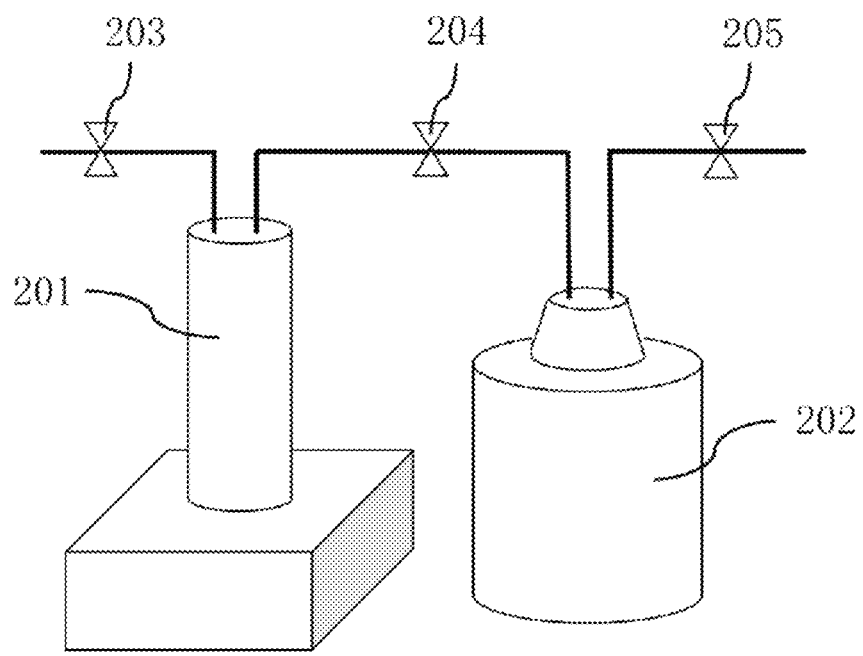
FIG. 3 illustrates a schematic diagram on the supercritical fluids treatment equipment provided by the embodiment 1 in the present disclosure.

The present embodiment provides a method of processing a polymer dielectric layer by supercritical fluid before being applied to preparing an organic field-effect transistor, wherein a structure of the organic field-effect transistor is shown in FIG. 2, comprising a plurality of steps below, specifically:

a. Placing a gate 101 in acetone, isopropanol, and deionized water in an order and cleaning by ultrasonic for 20 minutes in each step, then treating a substrate being cleaned by the ultrasonic in ultraviolet for 15 minutes.

b. Dissolving polyvinyl alcohol particles (having a molecular weight above 100,000) in deionized water, and a concentration of a polyvinyl alcohol solution is 7.0 wt. %. Stirring the polyvinyl alcohol solution for 4 hours after being heated to 70° C., and then adding a crosslinking agent ammonium dichromate, with a mass ratio of the crosslinking agent to the polyvinyl alcohol is 1:10. Stirring the solution for another 30 minutes for use after adding the crosslinking agent.

c. Spin-coating the polyvinyl alcohol solution prepared onto a surface of the gate 101 at a rotation speed of 3000 revolutions per minute.

d. The supercritical fluid treatment adopts a pressure controller 201 to compress carbon dioxide, which is connected to a reaction kettle 202 having a high-temperature and a high-pressure, and placing the gate 101 having a dielectric layer 102 spin-coated into the reaction kettle 202 for processing. Also, in order to remove water molecules effectively in a polyvinyl alcohol film, placing an appropriate amount of anhydrous calcium chloride particles 307 in the reaction kettle 202 as a water-removing-agent. A supercritical fluid treatment device is shown in FIG. 3, and an inner structure of the reaction kettle 202 is shown in FIG. 4.

e. Taking out the dielectric layer 102 and the gate 101 having been processed, and attaching a mask plate on a surface thereof, a hole of the mask plate is a square of 1 mm×1 mm, which is applied to depositing an organic semiconductor layer 103 on the dielectric layer 102 in a next step. Placing a piece having the mask plate stuck in a high-vacuum thermal evaporation chamber, and weighing a material of 0.01 g of 2,7-dioctyl[1]benzothieno[3,2-B][1]benzothiophene (C8-BTBT) as a vapor deposition source, a vacuum degree in the chamber is $2\times10^{-6}$ Torr, a vapor deposition rate is 0.5 Angstroms per second, and a thickness of the organic semiconductor layer 103 being vapor-deposited is 30 nm.

f. Taking out the piece having the organic semiconductor layer 103 vapor-deposited and replacing the mask plate, applied to vapor-depositing an electrode 104 and an electrode 105 made of metal. An interval between the electrode 104 and the electrode 105 is 100 microns, and a width of the electrodes is 1 mm, while an electrode interval area should be arranged totally above the organic semiconductor layer 103. Placing the piece having the mask plate stuck in a high-vacuum thermal evaporation chamber, weighing a material of 0.1 g golden (Au) as a vapor deposition source, a vacuum degree in the chamber is $2\times10^{-6}$ Torr, a vapor deposition rate is 0.5 Angstroms per second, and a thickness of the electrode 104 and the electrode 105 is 50 nm.

Figure 4:
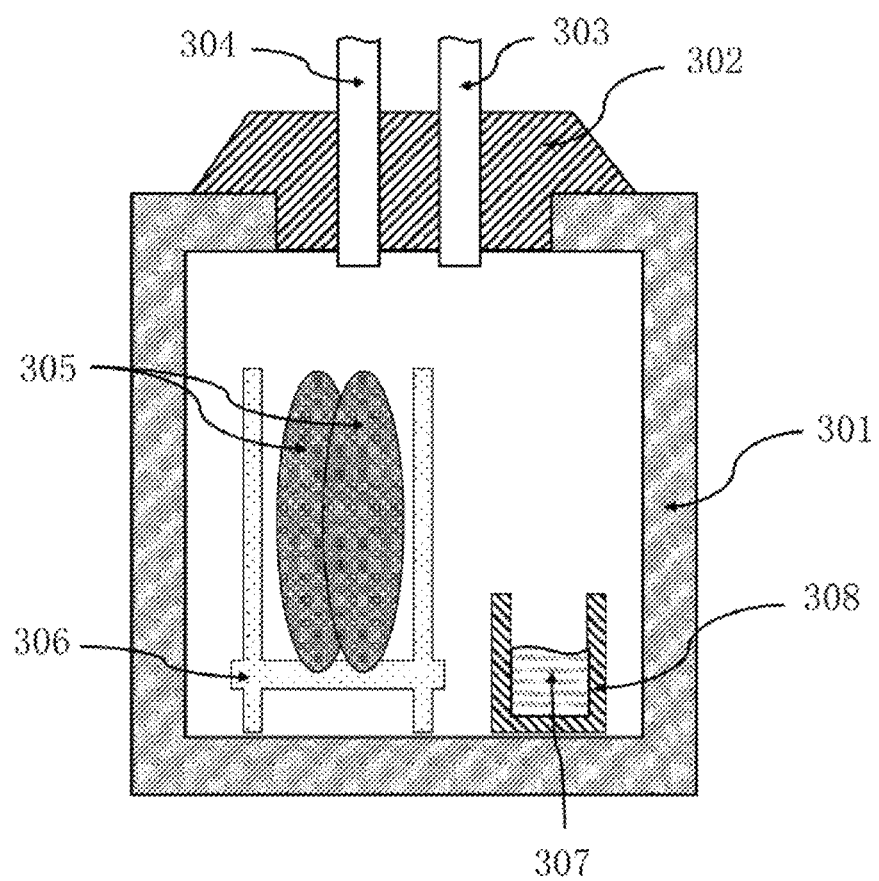
FIG. 4 illustrates a schematic diagram on a high temperature and high pressure reaction kettle container for the supercritical fluid treatment provided by the embodiment 1 in the present disclosure.

According to the present embodiment 1, in the step d, an internal structure of the reaction kettle 202 used for the supercritical fluid treatment is shown in FIG. 4. Placing a piece 305 to be processed on a quartz rack 306 before placing together in the reaction kettle 202. Weighing 10 grams of anhydrous calcium chloride 307 as the water-removing agent and placing in a quartz pot 308, before placing together in the reaction kettle 202. After finishing a plurality of placement, a lid 302 of the reaction kettle 202 is closed, wherein 304 refers to an air inlet pipe, and 303 refers to an air outlet pipe.

According to the present embodiment 1, in the step d, a schematic diagram of the supercritical fluid processing equipment is shown as FIG. 3, wherein the carbon dioxide enters the pressure controller 201 from a gas cylinder through a valve 203, while both a valve 204 and a valve 205 should be closed. When a pressure of a gas cylinder of carbon dioxide equals to that of the pressure controller 201, the valve 203 will be closed. By adjusting the pressure controller 201, the pressure is increased to 1500 psi. After the pressure is reached, the valve 204 is slowly opened to make the pressure in the pressure controller 201 reach a balance with the pressure in the reaction kettle 202, then closing the valve 204. Heating the reaction kettle 202 to 90° C. and adjusting the pressure in the pressure controller 201 to 3000 psi. After both the temperature and the pressure have reached a specified value, opening the valve 204 until the pressure in the reaction kettle 202 reaches 3000 psi, before closing the valve 204, followed by heating the reaction kettle 202 to 120° C. Maintaining the pressure of the reaction kettle 202 at 3000 psi and the temperature at 120° C. for 1 hour. After 1 hour is over, closing a heating equipment of the reaction kettle 202, and cooling the reaction kettle 202 to the temperature below 50° C., before opening the valve 205 slowly to relieve the pressure. When the pressure of the reaction kettle 202 equals to an atmospheric pressure, the lid 302 of the reaction kettle 202 can be opened, and the piece 305 after being processed can be taken out.

Comparative Embodiment 2

The fabrication method is same as that in the embodiment 1, except that neither the step d of a supercritical treatment nor the step e of depositing an organic semiconductor layer is performed later.

Comparative Embodiment 3

The fabrication method is same as that in the embodiment 1, except that no step e of depositing an organic semiconductor layer is performed later.

Figure 5:
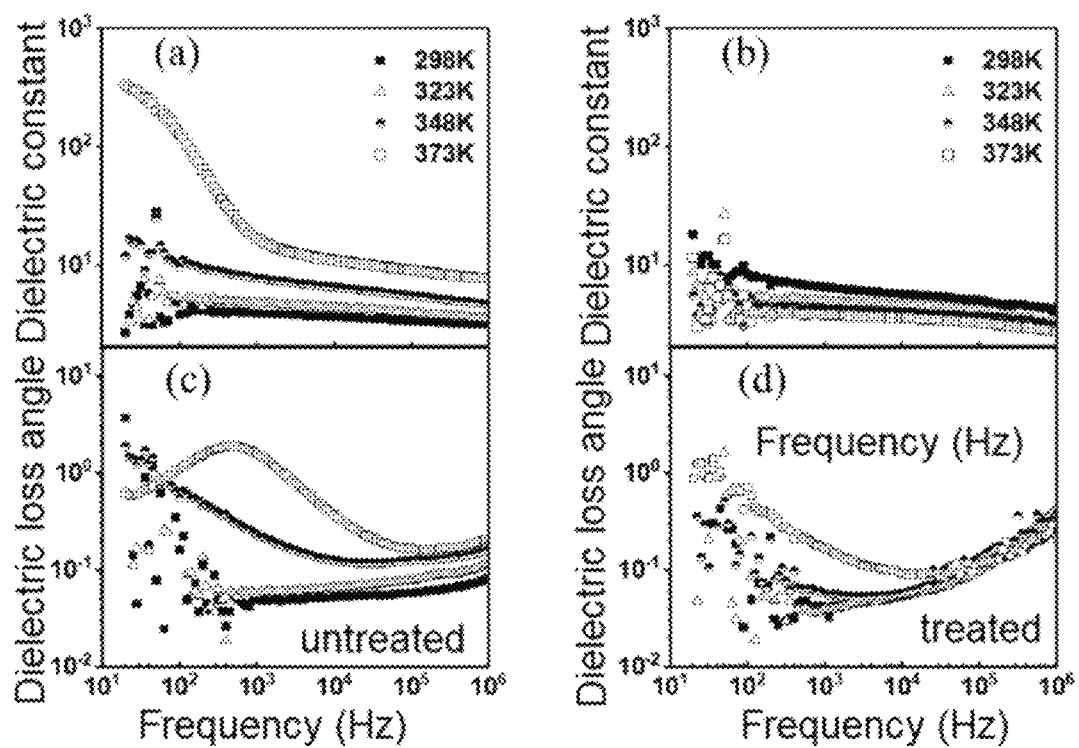
FIG. 5 illustrates a schematic diagram on a comparison of a plurality of metal dielectric property changes before and after a treatment in a comparative embodiment 2 and a comparative embodiment 3 after a dielectric test.

According to the comparative embodiment 2 and the comparative embodiment 3, through performing a dielectric spectrum test to both the comparative embodiment 2 and the comparative embodiment 3, as shown in FIG. 5, a result on left is a polyvinyl alcohol capacitor without the supercritical treatment, that is, a dielectric constant and a dielectric loss angle of the comparative embodiment 2, a result on right is a polyvinyl alcohol capacitor after the supercritical treatment, that is, a dielectric constant and a dielectric loss angle of the comparative embodiment 3. It can be seen from FIG. 5 (a) and (c) that the dielectric constant of an untreated polyvinyl alcohol film at 373K is higher than that in a plurality of other conditions, while a response at a low frequency ($<10^2$ Hz) is particularly significant, that has indicated that there is a relaxation phenomenon other than a self-polarization existing in the untreated polyvinyl alcohol (PVA) film, and this relaxation phenomenon is a slow process of a response at a low frequency. When the temperature is 373 K, the loss angle of the untreated PVA film has also a significant loss angle peak at $10^3$ Hz. By a frequency range in which the peak appears, it is able to speculate that the relaxation process is a slow response process, and a response time is consistent with a behavior of the mobile metal ion in the polymer film. Through FIG. 5 (b) and (d), it can be seen that the dielectric constant of the polyvinyl alcohol film having been treated with supercritical carbon dioxide is slightly lower than that of the untreated polyvinyl alcohol film, while the dielectric constant is less affected by the temperature, when the temperature is 373 K, the dielectric constant changes more slowly according to the frequency. Through a dielectric loss angle curve, it can be seen that there is no peak at low frequency, indicating that a content of the mobile metal ions in the polyvinyl alcohol film after the supercritical carbon dioxide treatment is greatly reduced.

Comparative Embodiment 4

The fabrication method is same as that in the embodiment 1, except that the step d of the supercritical treatment is not performed and neither the step e of depositing an organic semiconductor layer nor the step f of depositing the electrodes is performed later.

Comparative Embodiment 5

The fabrication method is same as that in the embodiment 1, except that neither the step e of depositing an organic semiconductor layer nor the step f of depositing the electrodes is performed later.

Figure 6:
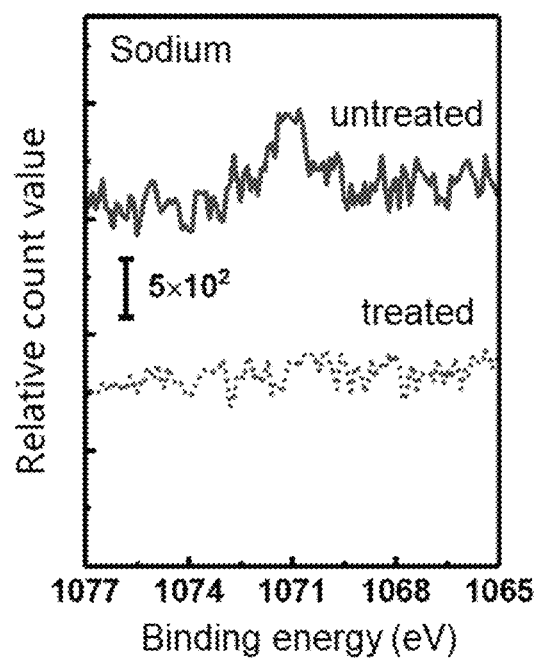
FIG. 6 illustrates a schematic diagram on a comparison of a sodium ion content change before and after a treatment in a comparative embodiment 4 and a comparative embodiment 5 after a X-ray photoelectron spectroscopy test.

According to the comparative embodiment 4 and the comparative embodiment 5, performing an X-ray photoelectron spectroscopy test on the comparative embodiment 4 and the comparative embodiment 5, as shown in FIG. 6, an upper curve is a dielectric layer without the supercritical fluids treatment, that is a 1s orbital signal count value of sodium element in the comparative embodiment 4, and a lower curve is a dielectric layer subjected to the supercritical fluid treatment, that is, a 1s orbital signal count value of sodium element in the comparative embodiment 5. It can be seen from the FIG. 6 that the untreated PVA film exhibits a distinct excitation peak for the sodium 1s, and the excitation peak decreases significantly after the supercritical fluid treatment. It is noted that, a 1s signal of a sample sodium having been treated with the supercritical carbon dioxide fluid is below a detection limit (the detection limit is about 0.01 at. %), and what is shown in an energy spectra is all noise signals. Through a quantitative X-ray fluorescence spectroscopy test, it can be seen that the content of the sodium element has been reduced from 141 ppm to 4 ppm after the supercritical fluid treatment, and as a result, it can be seen that the supercritical carbon dioxide fluid treatment can effectively remove the sodium ions in the polyvinyl alcohol film, and the content of the sodium element after been treated with the supercritical fluid has already been lower than a detection noise of the equipment.

Comparative Embodiment 6

The fabrication method is same as that in the embodiment 1, except that the step d of the supercritical treatment is not performed.

Figure 7:
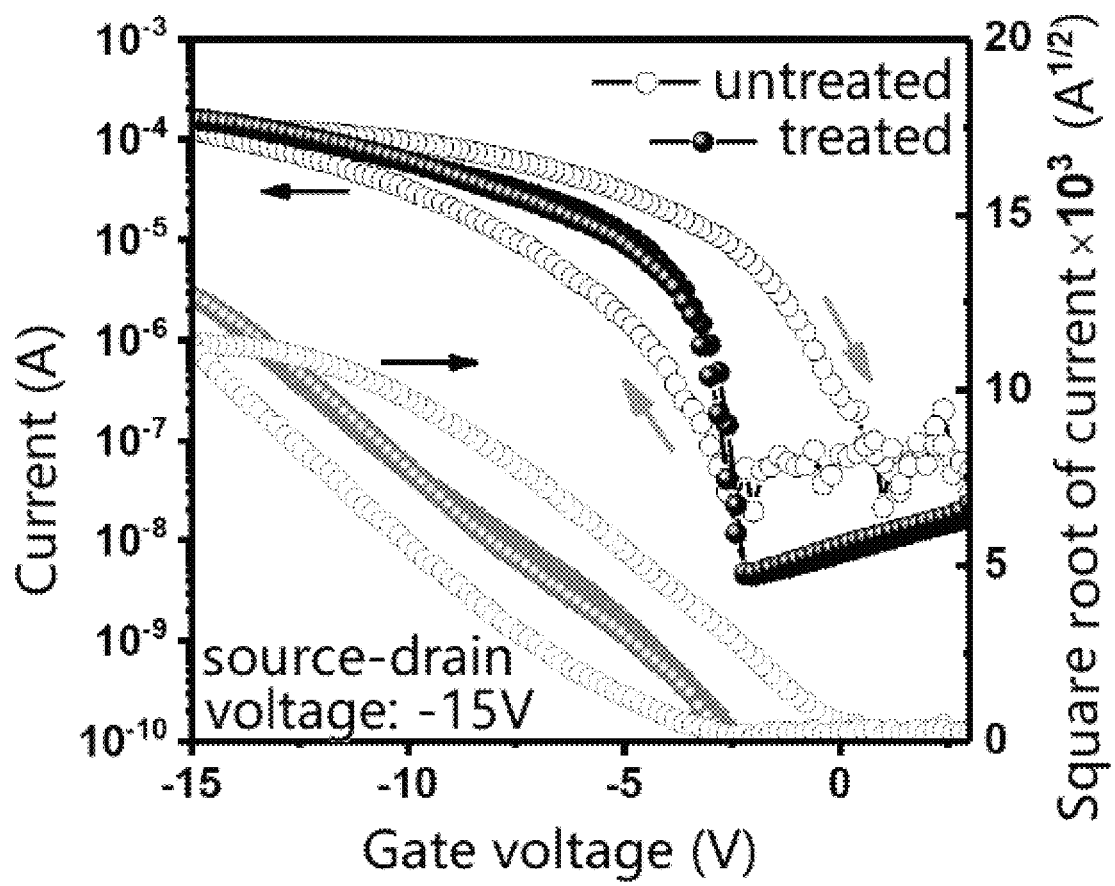
FIG. 7 illustrates a schematic diagram on a comparison of an OFET electrical performance improvement by adopting the supercritical fluids to treat a dielectric layer in the embodiment 1 and a comparative embodiment 6 after a transfer characteristic curve test.

According to the embodiment 1 and the comparative embodiment 6, performing a transistor transfer characteristic curve test to the embodiment 1 and the comparative embodiment 6, and a test result is shown in FIG. 7. Through a plurality of transfer characteristic curves, it can be seen that the OFET without adopting the supercritical treatment to the dielectric layer, that is, the comparative embodiment 6, when a gate voltage is relatively low (close to 0 volts), that is, when the transistor is off, a current is large and a fluctuation is obvious, that shows the dielectric layer without the supercritical fluid treatment has a serious leakage and unstable, which will cause a power consumption of an arithmetic circuit or a display control backplane to increase; meanwhile, when the gate voltage is relatively large (the gate voltage is −15 volts), that is, the transistor is in an on-state, a current of the on-state is slightly lower, which will cause a brightness too low when controlling the display; more significantly, there is a significant drifting phenomenon existing in a curve of the gate voltage when making a forward sweep (from zero to a negative voltage) and a curve of the gate voltage when making a reverse sweep (from a negative voltage to zero), that may lead to a plurality of errors when setting an on-state voltage and an off-state voltage of the control device, causing an overall power consumption of a circuit to increase. Observing the OFET device having the dielectric layer been treated by the supercritical fluids, that is, the embodiment 1, when the transistor is in the off-state, the current has an order of magnitude lower than that of the comparative embodiment 6, the overall power consumption of the circuit is greatly reduced; also, it can be seen that when in the on-state, the current of the transistor is larger than that of untreated, a ratio of the overall current to the switching current is larger, which is conducive to a higher brightness display; more significantly, the forward sweep curve and the reverse sweep curve of the gate voltage are almost overlap, indicating that the hysteresis effect of the device is basically eliminated after the supercritical fluid treatment.

Figure 8:
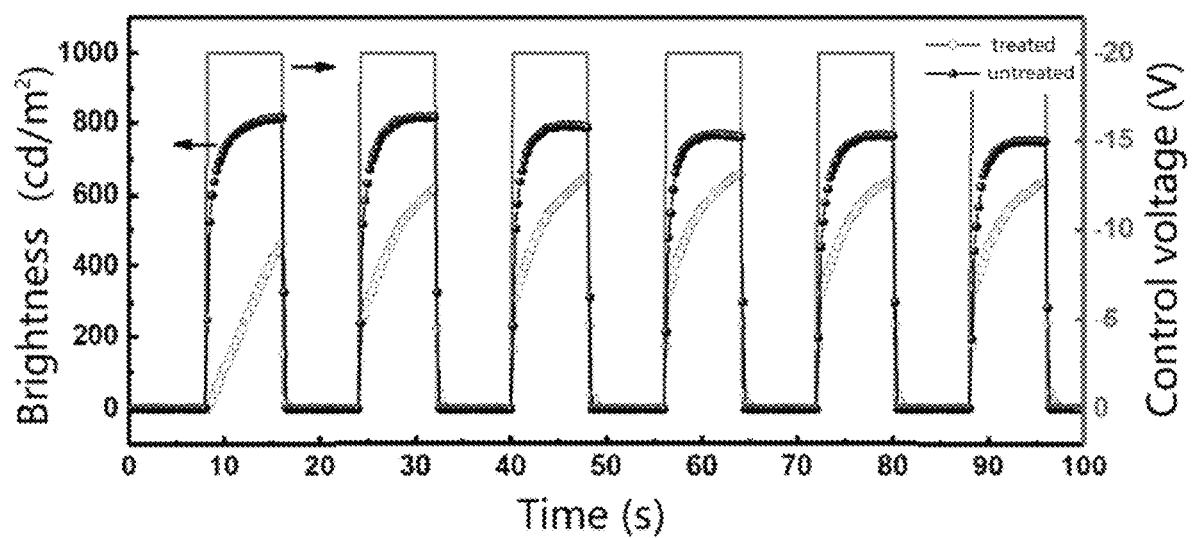
FIG. 8 illustrates a schematic diagram on a comparison of an OFET switch performance improvement by adopting the supercritical fluids to treat a dielectric layer in the embodiment 1 and the comparative embodiment 6 after connecting a plurality of organic light-emitting diodes in series.

Further, connecting the OFET without adopting the supercritical treatment to the dielectric layer, that is, the comparative embodiment 6, and the OFET device having the dielectric layer been treated by the supercritical fluid, that is, the embodiment 1, respectively in series to an organic light-emitting diode, and applying a continuously changing control voltage of the gate, before measuring a brightness change of the organic light-emitting diode. As shown in FIG. 8, the control voltage of the gate changes continuously between 0 volts and −20 volts, and changes in every 8 seconds, while the brightness curves of two groups of the organic light-emitting diodes will also change periodically and accordingly. It can be seen that, the light-emitting diode (LED) controlled by the transistor without the supercritical fluid treatment failed to reach a brightness saturation value within 8 seconds after turned on for a first time, and the brightness brightens at a slow rate, that seriously affects a display refresh rate; also, it can be seen that at a moment of turning off the transistor, the LED was not completely turned off accordingly, having a residual brightness existing. On an other hand, the LED controlled by the transistor subjected to the supercritical fluid treatment may reach a brightness of 500 candela per square meter in a short time, and the brightness becomes 0 in a short time after turning off the control voltage of the gate, which has effectively improved the refresh rate of an entire display, and improved an overall brightness thereof.

All above, the present disclosure provides an organic field-effect transistor and a fabrication method therefor. A dielectric loss of the polymer film after adopting the supercritical fluid treatment in the present disclosure is significantly reduced, and a content of impurities of metal moveable ions in the film is significantly reduced. The dielectric properties of the dielectric layer based on the treatment have been significantly improved. At a same time, the hysteresis effect of the OFET device adopting the dielectric layer having been processed has been basically eliminated, the sub-threshold slope of the OFET is also significantly reduced, and the carrier mobility rate is effectively improved. In addition, an OFET switching rate after being processed is improved, by connecting the LEDs in series, a switching rate of the LED may be increased.

It should be understood that, the application of the present disclosure is not limited to the above examples listed. Ordinary technical personnel in this field can improve or change the applications according to the above descriptions, all of these improvements and transforms should belong to the scope of protection in the appended claims of the present disclosure.

What is claimed is:

1. A fabrication method for an organic field-effect transistor, comprising:
    providing a gate;
    depositing a polymer material onto the gate and forming a dielectric layer;
    performing a supercritical fluid treatment on the gate having the dielectric layer deposited;
    depositing an organic semiconductor layer material on the dielectric layer having been processed, and forming an organic semiconductor layer; and
    depositing an electrode layer material on the organic semiconductor layer, and forming an electrode layer;
    wherein the step of performing the supercritical fluid treatment on the gate having the dielectric layer deposited further comprises:
    adopting carbon dioxide as a fluid, placing the gate having the dielectric layer deposited into a reaction kettle, adding a water-removing agent, pressurizing the carbon dioxide to 1500-3000 psi before passing into the reaction kettle, raising a temperature of the reaction kettle to 60-120° C., and keeping for a process period of 30 minutes to 1 hour.

2. The fabrication method according to claim 1, wherein the polymer material is selected from at least one of polyvinyl alcohol, polyvinyl phenol, polymethyl methacrylate, and polyvinylidene fluoride.

3. The fabrication method according to claim 1, wherein the gate is selected from one of heavily doped single crystal silicon, indium tin oxide-deposited polymer film, and metal-deposited polymer film.

4. The fabrication method according to claim 1, wherein a deposition method of the polymer material is a spin-coating method.

5. The fabrication method according to claim 1, wherein the organic semiconductor layer material is one or two of pentacene and 2,7-dioctyl[1]benzothieno[3,2-B][1]benzothiophene.

6. The fabrication method according to claim 1, wherein a method of depositing the organic semiconductor layer material is a vacuum thermal evaporation method, wherein a vacuum degree is $2\times10^{-6}$ Torr and an evaporation rate is 0.5 Angstroms per second.

7. The fabrication method according to claim 1, wherein a method of depositing the electrode layer material is a vacuum thermal evaporation method, wherein a vacuum degree is $2\times10^{-6}$ Torr and an evaporation rate is 0.5 Angstroms per second.

8. The fabrication method according to claim 1, wherein the electrode layer material is selected from one of gold, copper, and aluminum.

9. An organic field-effect transistor prepared by adopting the fabrication method according to claim 1.

* * * * *